(12) United States Patent
Nachman et al.

(10) Patent No.: US 11,662,391 B1
(45) Date of Patent: May 30, 2023

(54) DYNAMIC ADJUSTMENTS TO BATTERY PARAMETERS USING BATTERY METRICS

(71) Applicant: Amazon Technologies, Inc., Seattle, WA (US)

(72) Inventors: Ramez Nachman, San Francisco, CA (US); Don Brunnett, Pleasanton, CA (US); Bryan Holmdahl, San Jose, CA (US); Benjamin Thomas Gaide, San Jose, CA (US)

(73) Assignee: Amazon Technologies, inc., Seattie, WA (US)

( * ) Notice: Subject to any disclaimer, the term of this patent is extended or adjusted under 35 U.S.C. 154(b) by 402 days.

(21) Appl. No.: 17/073,573

(22) Filed: Oct. 19, 2020

(51) Int. Cl.
  *G01R 31/385* (2019.01)
  *G01R 31/367* (2019.01)
  *H01M 10/44* (2006.01)
  *H01M 10/42* (2006.01)
  *H01M 50/569* (2021.01)

(52) U.S. Cl.
  CPC ......... *G01R 31/385* (2019.01); *G01R 31/367* (2019.01); *H01M 10/4285* (2013.01); *H01M 10/446* (2013.01); *H01M 50/569* (2021.01)

(58) Field of Classification Search
  CPC .............. G01R 31/385; G01R 31/367; H01M 10/4285; H01M 10/446; H01M 50/569
  USPC ......................................................... 320/132
  See application file for complete search history.

(56) References Cited

U.S. PATENT DOCUMENTS

| 5,254,952 | A  | * | 10/1993 | Salley .................. G01R 31/385 |
| | | | | 324/426 |
| 10,666,077 | B1 | * | 5/2020 | Dharia .................. H02J 7/0071 |
| 11,451,068 | B1 | * | 9/2022 | Nachman ................. G01K 1/14 |
| 2016/0197506 | A1 | * | 7/2016 | Abiru ..................... H01M 10/48 |
| | | | | 320/134 |
| 2018/0045788 | A1 | * | 2/2018 | Kawai ............... H01M 10/4285 |
| 2021/0135474 | A1 | * | 5/2021 | Ha ...................... H02J 7/00712 |

OTHER PUBLICATIONS

P. Dutta, M. Feldmeier, J. Paradiso and D. Culler, "Energy Metering for Free: Augmenting Switching Regulators for Real-Time Monitoring," 2008 International Conference on Information Processing in Sensor Networks (ipsn 2008), 2008, pp. 283-294, doi: 10.1109/IPSN.2008.58. (Year: 2008).*

* cited by examiner

*Primary Examiner* — M Baye Diao
(74) *Attorney, Agent, or Firm* — Eversheds Sutherland (US) LLP

(57) ABSTRACT

Systems, methods, and computer-readable media are disclosed for dynamic adjustments to battery parameters using battery metrics. The device may be configured to determine a first value indicative of a battery voltage output during a first time interval, determine a second value indicative of a temperature during the first time interval, and determine a first acceleration factor for the battery during the first time interval based at least in part on the first value and the second value. The device may determine an adjusted number of charge cycles completed during the first time interval using the first acceleration factor, determine a total adjusted number of charge cycles of the battery, determine that the total adjusted number of charge cycles is equal to or greater than a first threshold, and cause the first maximum output voltage value to be reduced.

20 Claims, 6 Drawing Sheets

DYNAMIC ADJUSTMENTS TO BATTERY PARAMETERS USING BATTERY METRICS

BACKGROUND

Electronic devices may include batteries or other portable power sources. Certain batteries may be subject to swelling, expanding, or otherwise changing form over time. For example, batteries may swell or otherwise react to thermal events, age, corrosion, damage to components of the batteries, and other factors. Damaged batteries, or batteries that have been used a number of times, may still be charged at charging voltages that do not mitigate any potential adverse effects or further damage to the batteries. In addition, in some instances, one-size-fits-all adjustments to battery charging voltages may be implemented by devices, regardless of whether or not such adjustments are needed at a certain device. Accordingly, dynamic adjustments to battery parameters using battery metrics may be desired.

Figure 1:
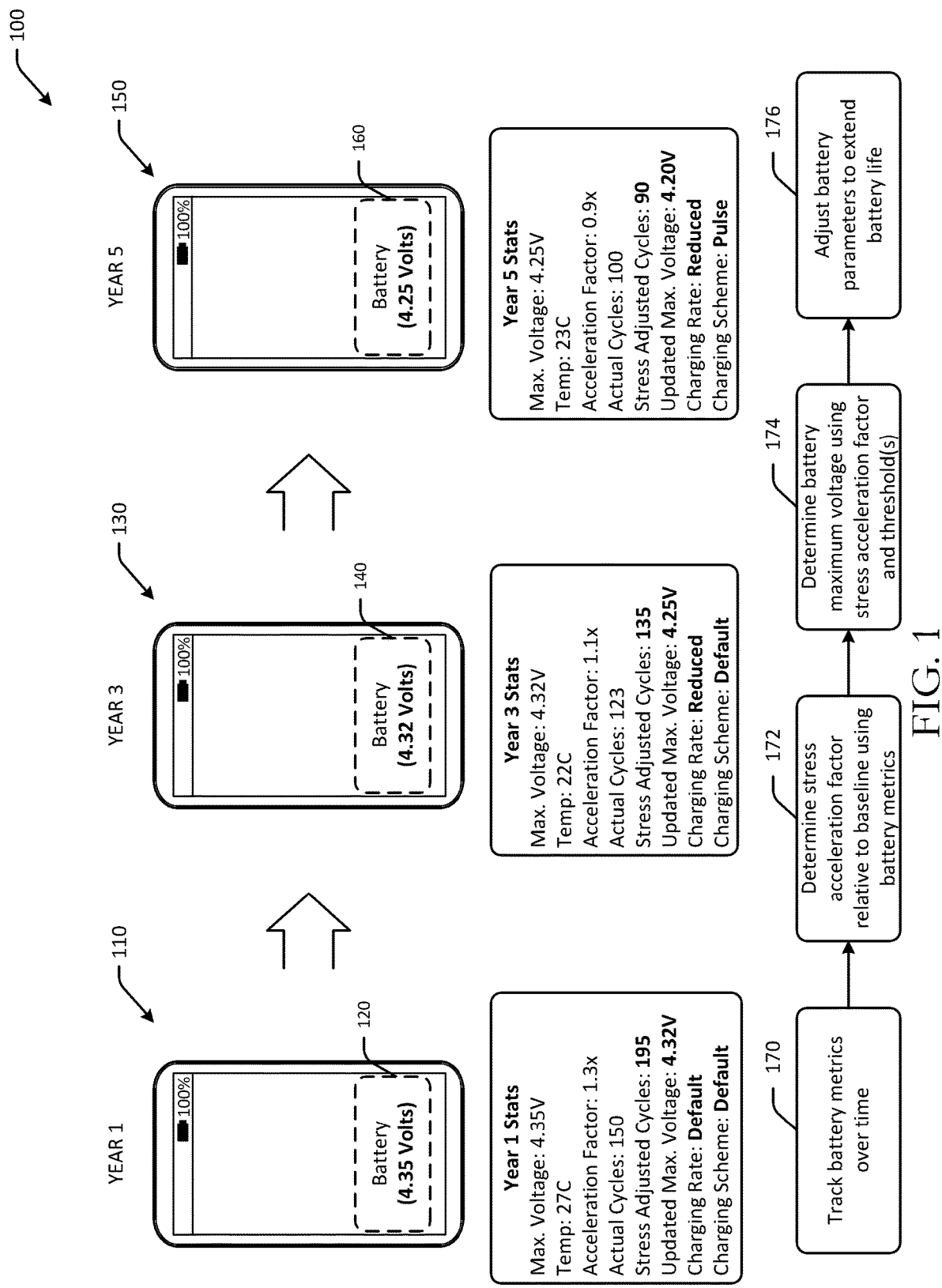
FIG. 1 is a schematic drawing of an example use case of dynamic adjustments to battery parameters using battery metrics over time in accordance with one or more embodiments of the disclosure.

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. The use of the same reference numerals indicates similar, but not necessarily the same or identical components. Different reference numerals may be used to identify similar components. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Overview

Electronic devices may be used to consume content. Some electronic devices may be portable and may include portable power sources, such as batteries and the like. The batteries or power sources may be rechargeable. Batteries used in electronic devices may have various capacities and/or charging voltages. For example, some batteries may have charging voltages (also referred to as maximum charging voltages or maximum output voltages) of 4.40 volts, while other batteries may have charging voltages of 9 volts, 3.90 volts, 1.5 volts, and other voltages. Over time, some batteries may deteriorate with respect to capacity. For example, a relatively new battery may have a charging voltage of 4.40 volts, while the same battery after a number of charge cycles (e.g., a charge cycle may be use of a battery's complete capacity, but not necessarily from a full charge to a full discharge, etc.) may retain a charging voltage of 4.35 volts, but may have a lower capacity. The useful life of batteries (e.g., the ability to power an electronic device, etc.) may therefore reduce over time. An example of a charge cycle may be using 40% of a battery's capacity, charging the battery to 100%, and then using 60% of the battery capacity. Although the battery may have been charged in between active usage, only one charge cycle may have been completed. Active usage, or usage, of a battery may include usage of the battery to power device non-essential functionality, such as powering a device display, wireless radios, etc., as opposed to essential functionality, such as internal clocks and other components of a device.

Certain charging voltages may cause thermal events, such as overheating, shocks, hot spots, and the like, or physical damage to batteries. For example, if a battery has a charging voltage of 4.2 volts, and the battery has some corrosion, or there is a power surge, the battery may be damaged. In some instances, damaged batteries may begin to swell or otherwise deform, which may damage a device that the battery is used to power. For example, if a smartphone battery swells, a display of the smartphone may be damaged or cracked, depending on the degree of swelling.

This disclosure relates to, among other things, systems, methods, computer-readable media, techniques, and methodologies for battery-specific management of battery charging settings, such as battery charging voltages, battery charging rates, and/or battery charging schemes or other battery parameters. Management and/or configuration of battery charging voltages (e.g., a maximum battery charging voltage, etc.) or other battery parameters may mitigate potential damage to batteries and the devices that use the batteries. For example, if a maximum battery charging voltage for a particular battery or a particular type or model of battery is to be reduced, so as to reduce risk of swelling or other damage, the maximum battery charging voltage may be modified in one or more policies or system properties at the device.

In some instances, batteries of a particular type may be used in more than one device and/or by multiple users. In such instances, management and/or configuration of battery charging policies may be implemented at the multiple devices. For example, a maximum battery charging voltage may be automatically reduced after a certain time period for all devices that have the same type of battery. Such automatic reductions may be based on estimated usage of the battery. However, not all of the batteries may have been used in accordance with the estimated usage. Therefore, the automated adjustment may not always be applicable to a certain battery. Embodiments of the disclosure include battery-specific adjustments to maximum battery voltages and/or other battery parameters, where the adjustments are determined for specific batteries based at least in part on the actual battery stress of the battery. The battery stress may include usage, voltages at which the battery is charged to and/or maintained at, temperatures to which the battery is exposed, and/or other factors. As a result, unnecessary adjustments may be avoided (thereby improving a user experience by avoiding reduction to maximum battery voltages as appropriate), and, in some instances, reductions to maximum battery voltages may be accelerated (thereby increasing safety by reducing risk of battery swelling, etc.). Device and/or battery life may be extended, and a reduced number of devices may be subject to unnecessary reductions in battery voltages, charging rates, and/or changes to charging schemes.

Embodiments of the disclosure include methods and systems that mitigate potential damage to batteries by dynamically adjusting battery parameters using battery-specific metrics. For example, certain embodiments may modify maximum charging voltages for batteries based at least in part on voltages of the battery over time, temperatures of the battery over time, usages of the battery over time, and/or a combination of these factors and/or other factors. In some instances, actual usage and/or environmental data of a battery may be compared to default or baseline data to determine whether to accelerate and/or decelerate changes to a maximum battery charging voltage. Certain embodiments may reduce swelling and other damage, and may reduce occurrence of thermal events, of batteries. Embodiments may therefore improve user experience and safety with electronic devices by managing battery voltage to avoid swelling and other thermal issues.

Battery cycling capacity loss may be accelerated by a number of factors, such as throughput (e.g., the change to a state of charge of the battery, etc.), charging rates, voltages, and temperatures to which the battery is subjected. Other factors may also impact cycling capacity loss. Embodiments of the disclosure may assess and cumulate the stress in the field for a specific battery using metrics data and one or more stress models, and may then cause an adjustment to be implemented, such as a derating of the battery voltage, a reduction to the charging rate, and/or a reduction to the amount of throughput given at high voltage based on a battery-specific modeling of capacity loss versus voltage, temperature, charging rate, and/or throughput. When the cumulative stress based on the metrics and model is determine to satisfy a threshold for a specific battery or device, the voltage derating or other battery parameter adjustment may be implemented. By doing so, the number of devices and/or batteries that are derated in the field is reduced, and the majority of batteries may not have to be derated.

Battery metrics may include actual usage information, such as energy throughput at a certain charging rate, voltage, temperature, and/or other information, as well as throughput, current, voltage, and temperature capacity loss acceleration factors determined using empirical data. Using the information, one or more predictive models can be generated to predict the time it takes the battery to lose a specific capacity percentage, and also predict when the capacity will collapse. Using the predictions, dynamic adjustments to battery parameters may be used to suppress the cycling capacity loss. Some embodiments cumulate the cycling stress on the battery by cumulating the device battery throughput in the field at every charging rate, voltage, and temperature, and may account for their acceleration to extend the battery life.

Referring to FIG. 1, an example environment 100 with a mobile device configured to implement dynamic adjustments to battery parameters using battery metrics is illustrated in accordance with one or more embodiments of the disclosure. The mobile device may be any suitable portable device, such as a smartphone, an e-reader, a tablet, an audio or video streaming device, an Internet of Things (IoT) device, a product ordering button or device, a home sensor, an aging in place device, an earphone, a speaker device, or another device. In the example of FIG. 1, the device may be a smartphone with a battery 120. The battery 120 may be a rechargeable battery, and may be any suitable type of battery, such as a lithium-ion pouch battery, and the like. The battery 120 may power the device.

At a first instance in time 110, such as a first year (e.g., Year 1) after a timestamp, the battery 120 may have a capacity or maximum charging voltage of 4.35 volts. The timestamp may be, for example, a time at which a charging cycle was completed on the device, a time at which a software update was received by or initiated at the device, a time when an update started executing on the device, a time when the update finished executing, or another time. The first instance in time may be after a length of time has elapsed or passed since a trigger event occurred. In one example, a trigger event may be completion of a charging cycle seven days or another time interval earlier. In other embodiments, the length of time may be the length of time since the last change to the charging voltage for the battery, the length of time since a software update was installed, the length of time since a certain number of battery charge cycles were completed, or another trigger event. At the first instance in time 110, the maximum charging voltage for the battery 120 may be set to 4.35 volts. The maximum charging voltage may be controlled by a charging circuit at the device, such as a power management integrated circuit, which may limit the charge of the battery 120 to 4.35 volts. The device may include a battery indicator that indicates the battery is fully charged, or 100% charged, when the battery 120 is charged at 4.35 volts.

Over time, the charging voltage of the battery 120 may be modified until a default battery charging voltage is reached. For example, in FIG. 1, a default battery charging voltage may be 4.20 volts at a second instance in time 130, such as at Year 3. The default battery charging voltage may be a predetermined de-rating or reduction of maximum battery charging voltage over time. For example, a device manufacturer or battery manufacturer may set maximum battery charging voltages that gradually decrease over time to reduce a likelihood of swelling or other battery damage over the lifespan of the battery. Such adjustments may be a one-size-fits-all approach to management of the battery and may not be applicable to individual batteries and/or devices.

However, the battery of the device may have been subject to conditions that were "worse" or otherwise different than those used to determine what the default battery charging voltage should be. For example, as illustrated in FIG. 1, battery statistics for the battery 120 of the device may be determined and used to calculate or determine maximum charging voltage adjustments for the battery 120. The battery statistics may be for a particular time interval, such as the elapsed time since the last charging cycle was completed, a number of hours, days, weeks, years, or another time interval. During the Year 1 time interval, the average voltage of the battery 120 may be determined to be 4.35 volts. The average voltage may be determined based at least in part on the actual voltage of the battery 120 measured at certain times or during intervals and divided over the time interval. The average voltage may be a normal average or a weighted exponential average. The average voltage may represent the average amount of capacity of the battery 120, or the average maximum output voltage. The average temperature of the battery 120 may be determined over the time interval as well. The average temperature of the battery 120 may represent the average temperature the battery 120 experienced during the time interval. The average temperature may be a normal average or a weighted exponential average. The battery temperature may be the battery skin temperature, the device temperature, the battery pack temperature, and/or a combination thereof. The battery temperature may be determined and/or recorded at certain intervals, added, and divided by the time interval to find the average temperature. The average temperature of the battery may be determined to be 27 degrees Celsius. In some embodiments, instead of an average temperature, a different temperature metric may be used, such as a maximum temperature or a minimum temperature that is measured during a given time interval.

The respective average voltage and the average temperature may be compared to baseline or default voltage and temperature values, where the default voltage and temperature values were used to determine a standard de-rating or reduction in maximum battery charging voltage. The comparison may be used to determine whether the reduction in maximum battery charging voltage for the battery 120 should be accelerated or decelerated, or if the battery 120 has been subject to substantially the same conditions as those used for the baseline reduction calculation. For example, the default voltage value may be 4.35 volts and the default temperature may be 25 degrees Celsius. In the example of FIG. 1, the average voltage may be 4.35 volts, which may be the default value, and the average temperature may be 27 degrees Celsius, which may be greater than the default value.

The comparison between the determined voltage and temperature values (e.g., average voltage and temperature, maximum voltage and temperature, minimum voltage and temperature, etc.) and the default voltage and temperature values may be used to generate or calculate a stress factor or stress acceleration factor. The stress acceleration factor may represent a difference between an experience of the battery (e.g., the voltages and temperature the battery has been subjected to, etc.) relative to that of the default or baseline expected usage. For example, due to the higher temperature exposure, the stress factor for the battery 120 after the first time interval at the first instance 110 may be 1.3× or 130%. Stress acceleration factors may be represented as percentages, factors, numerical values, points, colors, alphabetical characters, a combination thereof, and/or other suitable indicators.

In some embodiments, the battery charging rate and/or the battery charging scheme may be incorporated into the determination of the stress acceleration factor. For example, the battery charging rate may be the rate at which the battery is charged, or the speed of charging. A higher speed of charging may degrade the battery faster than a relatively slower speed of charging due to higher voltage differences. Similarly, charging schemes, such as default charging schemes compared to pulse charging schemes, may impact the stress acceleration factor differently. In the example of FIG. 1, the battery parameters of charging rate and charging scheme may have been set to default values.

The stress acceleration factor may be used to determine an adjusted number of cycles the battery has completed relative to an actual number of cycles. For example, the battery may have completed 150 actual cycles in Year 1. The 150 actual cycles may be multiplied by the stress acceleration factor of 1.3× to determine an adjusted number (e.g., an accumulated stress adjusted number, etc.) of cycles of 195. If the stress acceleration factor was less than expected or less than the baseline, the adjusted number of cycles may be less than the actual number of cycles, and may indicate an extended lifespan for the battery. The adjusted number of cycles may be added to the historical adjusted number of cycles of the battery 120 to determine an appropriate maximum battery charging voltage. For example, the device or a remote server may determine that the maximum battery charging voltage for the battery 120 is 4.32 volts based at least in part on the sum of the historical adjusted time values for the battery 120. Although discussed in the context of battery cycles, any suitable representative value for battery usage and/or consumption may be used, where such values may be modified to adjust for accumulated stress. Example substitutes may include length of time of usage, length of time of charging, charging speed, charging throughput, change in battery voltage, and so forth.

At the second instance in time 130 (e.g., Year 3), the maximum battery charging voltage of the battery 120 may be set to 4.32 volts. The modified battery 140 may therefore have a maximum battery charging voltage of 4.32 volts. The maximum battery charging voltage may be modified according to battery voltage setting data or a battery charging policy, which may include a look-up table or other structured or unstructured data, that is received from one or more remote servers and/or locally stored. The second instance in time may be four weeks after the first instance 110, or any other time interval. Although the maximum battery voltage was reduced from 4.35 volts in Year 1 to 4.32 volts in Year 3, the battery indicator at the device may continue to present a fully charged or 100% charged indication, as illustrated in FIG. 1. For example, the device may determine that the battery 140 is charged to the voltage value of 4.32 volts, and the device may present an indication that the battery 140 is fully charged. In some embodiments, rather than immediately changing the battery charging voltage from 4.35 volts to 4.32 volts, the battery charging voltage may be gradually changed in steps or increments over time. As a result, a user of the device may not immediately be impacted by a rapid or sudden change in battery charging capacity (e.g., suddenly reduced battery life, etc.).

In addition, the charging rate for the battery 140 may be reduced. For example, instead of charging at a rate of 1 C, the charging rate may be reduced to 0.9 C. The charging scheme may remain at default.

Battery statistics for Year 3 may indicate that the average voltage of the battery 120 during a time interval was 4.32 volts, and the average temperature of the battery may have been determined to be 22 degrees Celsius. The respective average voltage and the average temperature may be compared to the baseline or default voltage and temperature values, where the default voltage and temperature values were used to determine a standard de-rating or reduction in maximum battery charging voltage. The average voltage of 4.32 volts may be less than the default value of 4.35 volts, and the average temperature of 22 degrees Celsius may be less than the default value of 25 degrees Celsius. The comparison between the average voltage and temperature values and the default voltage and temperature values may be used to generate or calculate a stress acceleration factor for the time interval. The stress acceleration factor for the battery 140 after the second time interval at the second instance 130 may be determined to be 1.1× or 111%. The actual number of cycles may be 123 cycles, and the adjusted number of cycles for the time interval may be determined to be 135 cycles based at least in part on the stress acceleration factor. The adjusted number of cycles may be added to the historical number of cycles of the battery 140 to determine an appropriate maximum battery charging voltage (e.g., 195+Year 2+135, etc.). For example, the device or a remote server may determine that the maximum battery charging voltage for the battery 120 is 4.25 volts based at least in part on the sum of the historical adjusted time values for the battery 120.

At a third instance in time 150 (e.g., Year 5), the maximum battery charging voltage may be set at the battery 160 to 4.25 volts. The third instance in time 150 may be, for example, a certain amount of time after a trigger event (e.g., Year N). Although the battery 160 has a charging voltage that is 0.1 volts less than at Year 1, the battery indicator at the device may still present a fully charged or 100% charged indication when the battery 160 is charged at 4.25 volts. The battery 160 may be prevented from exceeding 4.25 volts for safety.

Although the maximum battery charging voltage in the example of FIG. 1 was reduced from 4.35 volts to 4.25 volts, a user of the device may not be negatively impacted or perceive the change due to the incremental reduction over time. At the same time, potential benefits of reducing the maximum battery charging voltage may still be gained.

Battery statistics for Year 5 may indicate that the average voltage of the battery 120 during a time interval was 4.25 volts, and the average temperature of the battery may have been determined to be 23 degrees Celsius. The respective average voltage and the average temperature may be compared to the baseline or default voltage and temperature values, where the default voltage and temperature values were used to determine a standard de-rating or reduction in maximum battery charging voltage. The average voltage of 4.25 volts may be less than the default value of 4.35 volts, and the average temperature of 23 degrees Celsius may be less than the default value of 25 degrees Celsius. The comparison between the average voltage and temperature values and the default voltage and temperature values may be used to generate or calculate a stress acceleration factor. The stress acceleration factor for the battery 120 after the third time interval at the third instance 150 may be determined to be 0.9× or 90%. The number of completed cycles during the time interval may be 100, and the adjusted number of cycles for the time interval may be determined to be 90 based at least in part on the stress acceleration factor. The charging rate may be reduced relative to the default, and the charging scheme may be a pulsed charging scheme. The adjusted number of cycles may be added to the historical adjusted number of cycles of the battery 120 to determine an appropriate maximum battery charging voltage. For example, the device or a remote server may determine that the maximum battery charging voltage for the battery 120 is 4.20 volts based at least in part on the sum of the historical adjusted time values for the battery 120.

As a result, the specific conditions to which the battery 120 may be used to determine proper battery de-rating and/or adjustments to maximum charging voltages. A risk of damage to batteries due to usage that exceeds the conditions for which baseline or default values was determined may be reduced, and, for batteries that experience conditions better than baseline or default values, premature degradation of battery performance may be avoided.

High battery temperatures and voltages can accelerate gas generation in batteries, which can lead to swelling and other issues. Embodiments of the disclosure can manage maximum battery voltages for certain devices and/or batteries based on particular usage conditions in or near real-time or after time intervals. Time intervals may be seconds, minutes, days, weeks, based on charging events, or other intervals. In an example embodiment, an amount of time the battery spends at a particular voltage and temperature is recorded and accumulated to determine a stress factor or acceleration value. When the cumulative time approaches a swelling risk threshold, a suitable voltage de-rating can be applied to keep the battery safely operational for the rest of the device life.

An example process flow is illustrated in FIG. 1. At a first operation 170, a device may track battery metrics, such as battery voltage, battery temperature, battery charging rate, and/or battery throughput over time. For example, the device may periodically or at certain time intervals determine a battery voltage, a battery temperature, and/or other battery parameters. Other metrics that may be tracked include charging times, charging rates, depth of discharge, and/or other metrics. The voltage and temperature data may be recorded at the device or sent to one or more remote servers. By default, the device may operate with a default battery maximum voltage. In one embodiment, firmware of the device may be used to counts hours or time at certain voltages and/or temperatures during actual usage. In some embodiments, the time the device or battery spends at every voltage and temperature may be recorded. Data comes in records of elapsed time but the cumulative time may include (i) time device spent in each of the charging states (charge, discharge, idle) registering voltages and temperatures to be send to the cloud or to memory for later to be send to the cloud; (ii) periods of time when device is off or in sleep mode in between usages, and there is no metrics flow; (iii) long term storage time, and/or other data.

At a second operation 172, the device and/or a remote server may determine a stress acceleration factor for the battery relative to a baseline using the battery metrics. A stress acceleration factor may be a battery environment value that is indicative of a difference between an environment of the battery and the baseline ambient environment of the battery. In one example, the stress factor may be a value used to determine an adjusted number of cycles completed by the battery. For instance, an adjusted number of cycles may be equivalent to a number of cycles had been subject to baseline conditions. In an example, a baseline temperature may be 25 degrees Celsius and a baseline voltage may be 4.35 volts.

At a third operation 174, the device and/or a remote server may determine a battery maximum voltage using the stress acceleration factor and one or more threshold(s). For example, a lookup table or database with elapsed time values and corresponding maximum voltages may be stored or accessed by the device. The database may indicate maximum output voltage values after different threshold amounts of time have elapsed. For example, a first threshold may be one year, a second threshold may be eighteen months, a third threshold may be two years, and so forth. Depending on the conditions of the battery, the threshold amounts of time may be met sooner than an actual amount of time elapses (e.g., the threshold of one year could be met in eleven months depending on battery conditions, etc.).

At a fourth operation 176, the device may adjust the battery parameters to extend a life of the battery. For example, based at least in part on the database value, the device may cause the power management integrated circuit to set a maximum battery charging voltage, a charging rate, and/or a charging scheme accordingly. In some embodiments, the device may generate a notification indicating to users that the maximum battery charging voltage or other battery parameter has been modified, to exchange the device or battery for a new one for free, to modify user behavior, and/or for another purpose.

As a result, battery capacity and/or maximum battery charging voltages used to charge batteries may be increased or decreased while minimizing impact on a user experience. By managing and/or configuring the maximum battery charging policies, thermal events and/or swelling or other undesired occurrences may be reduced or avoided.

In one example embodiment, the device may determine a first charging rate at the battery, where the first charging rate is indicative of a speed at which the battery charges, and may determine a first average battery temperature of the battery during a first time interval. The device may determine a first average battery output voltage during the first time interval, which may be reflective of the battery capacity or maximum output voltage. The device may determine a first stress acceleration factor for the battery during the first time interval using the first charging rate, the first average battery temperature, and the first average battery output voltage. The stress acceleration factor may be compared to a default stress acceleration factor of 1.0 for default usage of the battery. The device may determine a first number of actual charge cycles completed by the battery during the first time interval, and may determine a first adjusted number of charge cycles completed by the battery during the first time interval by multiplying the first number of actual charge cycles by the first stress acceleration factor, where the first adjusted number of charge cycles is indicative of actual usage of the battery during the first time interval relative to default usage of the battery during the first time interval. The device may determine a total number of completed cycles for the battery by determining a historical adjusted number of charge cycles completed by the battery, and determining a total adjusted number of charge cycles completed by the battery by adding first adjusted number of charge cycles to the historical adjusted number of charge cycles. The total adjusted number of charge cycles completed by the battery may be the actual number of charge cycles completed by the battery from its first use or from its initial use to a current period in time modified by the respective acceleration factors calculated for the battery. The first use or initial use of the battery may be one or more of: the date of manufacture of the battery, the first time the battery was fully charged or charged to a certain level, the first time the battery was fully discharged or discharged to a certain level, the first time the battery was coupled to any device, the first time the battery was coupled to a charger, or any other instance in which the battery was first deployed for use with a device. The battery may determine that the total adjusted number of charge cycles satisfies a first battery derating threshold at which the first maximum allowed charging voltage is reduced to a second maximum allowed charging voltage. The device may therefore cause the battery to limit charging to the second maximum allowed charging voltage.

Accordingly, embodiments of the disclosure may improve safety, and may reduce gaseous swelling of batteries. Some embodiments may reduce or eliminate the need for blanket battery de-rating. Some embodiments may extend the battery swelling lifetime safely beyond five years. Embodiments may be applicable to various battery or device manufacturers, battery chemistries, and so forth.

Example embodiments of the disclosure provide a number of technical features or technical effects. For example, in accordance with example embodiments of the disclosure, certain embodiments of the disclosure may include batteries that with charging voltages configured based on battery condition data locally and/or by one or more remote servers. Some embodiments may include devices configured to determine device usage metrics, battery usage metrics, lengths of elapsed time, and other metrics. The above examples of technical features and/or technical effects of example embodiments of the disclosure are merely illustrative and not exhaustive.

One or more illustrative embodiments of the disclosure have been described above. The above-described embodiments are merely illustrative of the scope of this disclosure and are not intended to be limiting in any way. Accordingly, variations, modifications, and equivalents of the embodiments disclosed herein are also within the scope of this disclosure. The above-described embodiments and additional and/or alternative embodiments of the disclosure will be described in detail hereinafter through reference to the accompanying drawings.

Illustrative Embodiments and Use Cases

Figure 2:
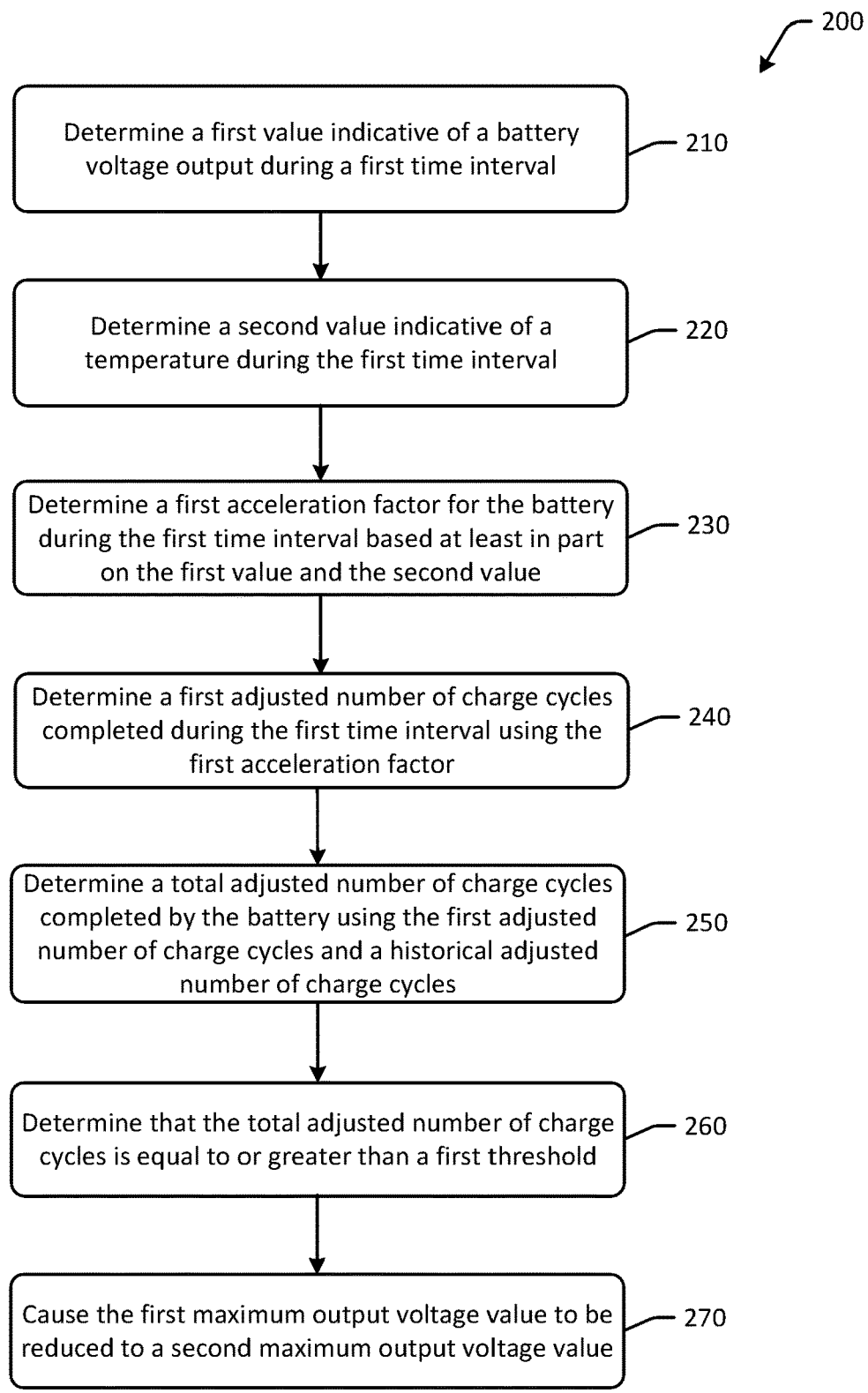
FIG. 2 is an example process flow for dynamic adjustments to battery parameters using battery metrics in accordance with one or more embodiments of the disclosure.

FIG. 2 is an example process flow 200 for dynamic adjustments to battery parameters using battery metrics in accordance with one or more embodiments of the disclosure. One or more of the operations of FIG. 2 may be performed at a client device and/or remote server in some embodiments. One or more of the operations of the process flow 200 may be optional and may be performed in any order or at least partially concurrently in some embodiments.

At block 210 of the process flow 200, a first value indicative of a battery voltage output during a first time interval may be determined. For example, one or more computer processors may execute one or more modules having computer-executable instructions to determine a first value indicative of a battery voltage output during a first time interval. The battery voltage output may be a voltage output by the battery in between charging events. The battery voltage may be an average battery voltage during the time interval, a maximum battery voltage during the time interval, a minimum battery voltage during the time interval, or another value representative of the battery voltage during a point in time of the time interval. For example, if the battery was charged to 4.0 volts and was fully discharged, the average battery voltage output for the time interval may be 4.0 volts. Time intervals may span one or more charging events as well. In such instances, the average battery voltage output may be determined by averaging the 4.0 during the first charging event with the voltage output prior to a subsequent charging event. The battery may be at the same device as the one or more computer processors or may be at a different device (e.g., a remote server may perform one or more determinations, etc.). The average battery voltage output of the battery may be determined by a device by monitoring battery voltage over time.

In some embodiments, time intervals may be event triggered. An example event trigger may be a charging event. For example, the device may determine that a charger state of the device has changed from a first state to a second state, such as from connected to disconnected. The first length of time and the second length of time may have occurred while the charger state was the first state. The charger state may be indicative of whether or not the device is connected to a charger or is otherwise charging. For example, when the device is connected to a charger that is connected to a power source, such as a wall outlet, the charger state may indicate charging, and when the charger or power source is disconnected, the charger state may indicate not charging. A change in charging state may trigger a calculation of stress factor over a previous time interval. For example, the device may determine that a charger state has changed from a first state to a second state, and the first time interval may occurred while the charger state was the first state, such as a discharging state.

At block 220 of the process flow 200, a second value indicative of a temperature during the first time interval may be determined. For example, one or more computer processors may execute one or more modules having computer-executable instructions to determine a second value indicative of a temperature during the first time interval. The temperature may be an average temperature during the time interval, a maximum temperature during the time interval, a minimum temperature during the time interval, or another value representative of the temperature during a point in time of the time interval. The temperature may be an average temperature of the battery pack, the device, a battery skin, and/or the temperature of a different component of the user device and may optionally be averaged over a time interval. In some embodiments, the average temperature may be the average of more than one component temperature over the first time interval. For example, the device may determine a first average temperature of the battery itself, and may determine a second average temperature of the device, such as a device housing or internal device temperature, and may determine the second value using the first average temperature and the second average temperature. In some instances, ranges may be used instead of particular values. For example, the average temperature may represent a time the temperature was between two values. In some embodiments, the battery temperature may be one or more of a battery pack temperature, a battery skin temperature, a device temperature, and/or a combination thereof.

In some embodiments, average voltage values and/or temperature values may be determined over a time interval, instead of, or in addition to, individual voltage values or temperature values determining periodically. For example, the device may determine an average voltage of the battery (e.g., first average battery output voltage, etc.) during a time interval, where the first voltage is the average voltage. The device may determine an average temperature (e.g., first average battery temperature of the battery, etc.) during the time interval, where the first temperature is the average temperature.

At block 230 of the process flow 200, a first acceleration factor for the battery during the first time interval based at least in part on the first value and the second value may be determined. For example, one or more computer processors may execute one or more modules having computer-executable instructions to determine a first acceleration factor for the battery during the first time interval based at least in part on the first value and the second value. The first acceleration factor may represent a difference between the stress placed on the battery during the first time interval relative to a baseline stress level. The first acceleration factor may be greater than, equal to, or less than the baseline stress level, and may be represented numerically as greater than, equal to, or less than 1.0 or 100%, where 1.0 or 100% is the baseline. Other alphanumeric representations may be used for the first acceleration factor.

In some embodiments, the determined voltage and temperature values, or average voltage and temperature values, may be compared to baseline respective values that were used to calculate the first acceleration factor. For example, a baseline battery temperature may be associated with a baseline ambient environment of the battery, and may have been used to calculate or determine a battery de-rating schedule. The device may determine whether the measured battery temperature is greater than, less than, or equal to the baseline battery temperature. The first acceleration factor may be associated with a baseline battery voltage indicative of a battery voltage used to calculate or determine the battery de-rating schedule. The device may determine whether the measured battery voltage is greater than, less than, or equal to the baseline battery voltage. To determine the first acceleration factor, in one example, the device may determine, based at least in part on (i) a difference between the battery temperature and the baseline battery temperature, and (ii) a difference between the battery voltage and the baseline battery voltage, the first acceleration factor for the battery during the first time interval, where the first acceleration factor is indicative of a difference between an environment of the battery and the baseline ambient environment of the battery. The first acceleration factor may reflect a magnitude or scale difference between actual battery environment and expected or baseline battery environment.

In some embodiments, the device may determine a third value indicative of a charging rate at the battery. For example, the third value may represent a current charging rate and/or rates implemented for charging the battery. The third value may be used in addition to, or instead of, the first value and/or the second value to determine the first acceleration factor. For example, the device may be configured to determine the first acceleration factor for the battery based at least in part on the first value, the second value, and/or the third value.

In some embodiments, the device may determine a fourth value indicative of a throughput at the battery. For example, the fourth value may represent a battery throughput during charging or discharging of the battery. The fourth value may be used in addition to, or instead of, the first value, the second value, and/or the third value to determine the first acceleration factor. For example, the device may be configured to determine the first acceleration factor for the battery based at least in part on the first value, the second value, the third value, and/or the fourth value.

At block 240 of the process flow 200, a first adjusted number of charge cycles completed during the first time interval using the first acceleration factor may be determined. For example, one or more computer processors may execute one or more modules having computer-executable instructions to determine a first adjusted number of charge cycles completed during the first time interval using the first acceleration factor. To determine the first adjusted number of charge cycles, the device may determine a number of actual completed cycles, and may multiply by the first acceleration factor. The result may be used to indicate the first adjusted number of charge cycles for the first time interval. The first adjusted number of charge cycles may be the effective number of charge cycles completed by the battery due to the stress placed on the battery. The first adjusted number of charge cycles may be greater than, equal to, or less than the actual number of charge cycles.

At block 250 of the process flow 200, a total adjusted number of charge cycles completed by the battery using the first adjusted number of charge cycles and a historical adjusted number of charge cycles may be determined. For example, one or more computer processors may execute one or more modules having computer-executable instructions to determine a total adjusted number of charge cycles completed by the battery using the first adjusted number of charge cycles and a historical adjusted number of charge cycles. The total adjusted number of charge cycles may be the sum of adjusted number of charge cycles for some or all preceding time intervals. For example, if the adjusted number of charge cycles for the first interval is 15 charge cycles, and the historical adjusted number of charge cycles (e.g., the adjusted number of charge cycles for preceding time intervals, etc.) is 100 charge cycles, the total adjusted number of charge cycles may be 115 charge cycles.

The historical adjusted number of charge cycles may be updated as time intervals are completed. For example, the device may determine a third value indicative of an average battery voltage output during a second time interval, and may determine a fourth value indicative of an average battery temperature during the second time interval. The device may determine a fifth value indicative of a first charging rate at the battery, and may determine a second acceleration factor for the second time interval based at least in part on the third value, the fourth value, and the fifth value. The device may determine a number of actual charge cycles completed by the battery during the second time interval. The device may determine a second adjusted number of charge cycles completed by the battery during the second time interval based at least in part on the second acceleration factor and the number of actual charge cycles, and may determine the total adjusted number of charge cycles completed by the battery based at least in part on the second adjusted number of charge cycles to the historical adjusted number of charge cycles. The device may determine that the total adjusted number of charge cycles satisfies a second threshold, and may cause a charging circuit at the device to implement a second charging rate instead of the first charging rate, where the second charging rate is slower than the first charging rate.

At block 260 of the process flow 200, it may be determined that the total adjusted number of charge cycles is equal to or greater than a first threshold. For example, one or more computer processors may execute one or more modules having computer-executable instructions to determine that the total adjusted number of charge cycles is equal to or greater than a first threshold. The first threshold may be a threshold at which a battery parameter adjustment is implemented. For example, the first threshold may be a number of completed cycles after which the battery voltage is derated by a predetermined amount, or the charging rate is modified, or the charging scheme is modified, and so forth. The first threshold may be a baseline number of completed cycles, and the total adjusted number of charge cycles may be compared to the baseline number of completed cycles of the first threshold to determine whether any changes to battery parameters are to be implemented. In this manner, the actual battery metrics can be used to determine the effective number of charge cycles completed by the battery, and to determine whether changes are to be implemented ahead or behind schedule.

At block 270 of the process flow 200, a maximum output voltage value of the battery may be caused to be reduced from about a first maximum output voltage value to about a second maximum output voltage value. For example, one or more computer processors may execute one or more modules having computer-executable instructions to cause a maximum output voltage value to be reduced from about a first maximum output voltage value to about a second maximum output voltage value. The second maximum output voltage value may be determined using a lookup table, a database, received from a remote server, or otherwise determined by the device. An example table is discussed with respect to FIG. 4. In some embodiments, the second maximum output voltage value may be determined using the first threshold. For example, if the first threshold is a completed number of cycles of 200, the second maximum output voltage value may be stored in association with the completed number of cycles of 200 and may therefore be determined using the 200 value. In another example, the device may determine, using the sum of the battery consumption values and any historical consumption values, a second maximum allowed charging voltage that is less than the first maximum allowed voltage, and may cause a maximum allowed voltage of the battery to be reduced from the first maximum allowed voltage to about the second maximum allowed voltage. As the battery continues to be used, subsequent modifications to the maximum output voltage value may be implemented. For example, the device may determine that the total adjusted number of charge cycles satisfies another threshold, and may cause the second maximum output voltage value to be reduced to a third maximum output voltage value.

Some embodiments may include more than one threshold. In addition, a threshold may be used to trigger one or more changes to battery parameters. For example, the device may determine that the total adjusted number of charge cycles is equal to or greater than a second threshold. The second threshold may trigger a voltage derating and/or a change to a charging rate of the battery. The device may therefore cause a charging circuit at the device to implement a second charging rate instead of a first charging rate, where the second charging rate is less than the first charging rate. The charging rate may represent a speed at which the battery charges, such as 1 C (meaning that a fully charged battery rated at 1 Ah should provide 1 A for one hour, and the same battery discharging at 0.5 C should provide 500 mA for two hours, and at 2 C it delivers 2 A for 30 minutes).

In another example, the device may determine that the total adjusted number of charge cycles satisfies a second threshold at which a modified charging scheme is implemented, and may therefore cause a charging circuit at the device implement the modified charging scheme. The charging scheme may be one or more of: a steady charging rate, a two-tier charging rate, a three-tier charging rate, or a different scheme. For example, a steady charging rate may be a consistent charging rate of 1 C or another value until the battery is fully charged. In contrast, a two-tier charging rate may be a charging rate of 1 C until the battery is 75% charged, and then a 0.5 C charging rate until the battery is fully charged, and so forth. Modifications to the charging scheme battery parameter may increase the amount of time to charge the battery, but may extend the life of the battery and reduce the risk of swelling.

In another example, the device may determine that the total adjusted number of charge cycles satisfies a battery charging scheme threshold at which a pulse charging scheme is implemented, and may therefore cause a charging circuit at the device implement the pulse charging scheme. The pulse charging scheme may be different from the charging rate scheme in that pulse charging may use a series of voltage or current pulses that are fed to the battery to overheating the battery. Other changes to charging schemes may include changes to temperature values at which certain charging rates are implemented. For example, a charging rate designated for a temperature of 30 degrees Celsius may be extended to a temperature of 35 degrees Celsius. In other embodiments, rather than modifying a charging scheme, the threshold(s) may be dynamically adjusted. For example, if a first charging rate is to be used between a first temperature and a second temperature, rather than modifying the first charging rate, the first temperature and/or the second temperature may be modified instead.

Figure 3:
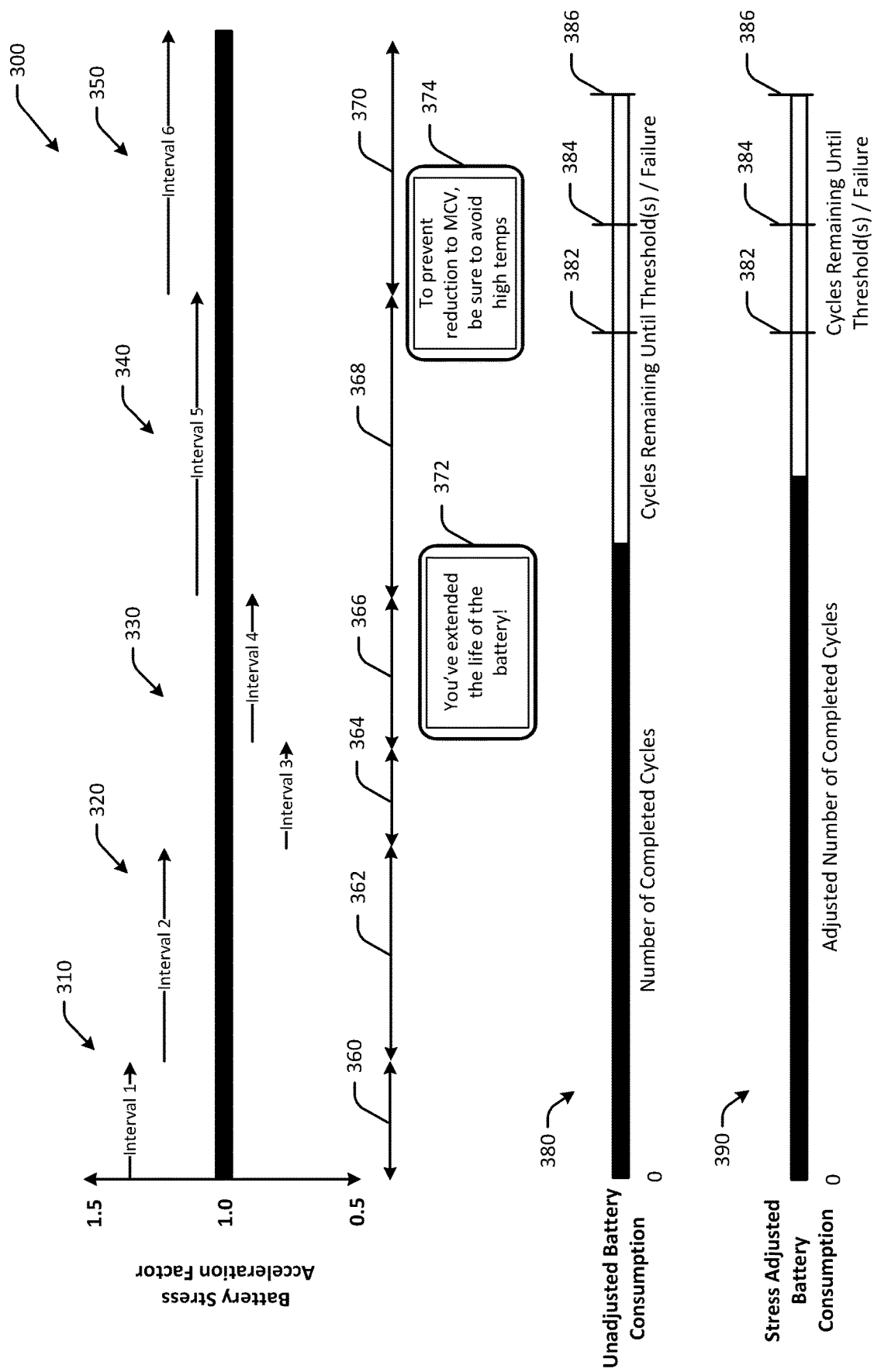
FIG. 3 is a schematic drawing of example battery stress acceleration factor determinations and corresponding stress adjusted battery consumption in accordance with one or more embodiments of the disclosure.

FIG. 3 is a schematic drawing of example battery stress acceleration factor determinations and corresponding stress adjusted battery consumption in accordance with one or more embodiments of the disclosure. The illustrations of FIG. 3 are for illustrative purposes only and are provided only as an example implementation.

In FIG. 3, example battery stress acceleration factor data 300 illustrates baseline battery environment and usage as a straight line (depicted as a thick bold line at 1.0) over time. The baseline environment for the battery is depicted as correlating to a battery stress acceleration factor of 1.0, or a default battery stress acceleration factor. The baseline ambient battery environment may be the values used to determine a default battery maximum charging voltage reduction over time. However, the illustrated data 300 illustrates that actual usage of the battery, or the actual battery environment, is different than the baseline ambient battery environment. For example, different vectors for different time intervals (which may be the same length of time or different lengths of time) are depicted. The vectors may incorporate battery temperatures and battery voltages during the interval, and the length of the vector may represent the amount of time in the time interval. For example, a first interval 310 may be for a first length of time 360, a second interval 320 may be for a second length of time 362, third and fourth intervals 330 may be for a third length of time 364 and a fourth length of time 366, respectively, a fifth interval 340 may be for a fifth length of time 368, a sixth interval 350 may be for a sixth length of time 370, and so forth. The intervals may represent a length of time between charging events (e.g., between subsequent instances the battery was connected to a charger, etc.). For example, some or all of the times the battery is connected to a charger, battery metrics may be determined locally and/or sent to a remote server. In some embodiments, the respective lengths of time may be used to determine an impact of the battery environment experienced during the time interval to the overall acceleration or stress factor of the battery.

The vectors representing intervals may be positioned on the Y-axis so as to represent a corresponding battery stress acceleration factor value. For example, during the first time interval 310, the battery may have had a more stressful or strenuous experience than the baseline battery environment and usage. Accordingly, the battery stress acceleration factor for the first time interval 310 may be 1.4. This could have been caused by overcharging, subjecting the battery to higher than normal temperatures, etc. Similarly, during the second time interval 320, the battery may have had a more strenuous experience than the baseline battery environment and usage. For example, one or both of the battery temperature and battery voltage may have been higher than the baseline values. During the third and fourth time intervals 330, the battery may have had a less strenuous experience than the baseline ambient battery environment. For example, one or both of the battery temperature and battery voltage may have been less than the baseline values. For example, the user may not have used the device, the user may not have kept the device in sunlight, the user may not have left the device on a charger, and/or the like. As a result, the vector representing each of the third and fourth time intervals 330 may be positioned lower than the baseline on the Y-axis. During the fifth time interval 340 and the sixth time interval 350, the battery may have had a more strenuous experience than the baseline ambient battery environment. For example, one or both of the battery temperature and battery voltage may have been higher than the baseline values.

The overall battery stress acceleration factor may be determined by averaging the individual battery stress acceleration factor values over the number of intervals, the result of which may or may not be averaged for time. In the example of FIG. 3, the average or overall battery stress acceleration factor may be about 1.14 if weighted for length of respective interval or about 1.11 if determined using the number of intervals and unweighted for time. In either instance, the overall battery stress acceleration factor for the battery may be greater than 1.0, thereby indicating that the battery has been subject to more stress than the baseline expectation.

Because the actual battery stress acceleration factor is worse, or more strenuous, than the baseline, battery voltage de-rating (or another change to battery parameters) may be accelerated. For example, as illustrated in unadjusted number of completed cycles 380, baseline battery consumption may result in a first change to battery parameters, such as a first battery derating, at a first threshold 382, which may be 200 completed cycles. At a second threshold 384, another change, such as another voltage derating or a change to charging rate, may be implemented. At a third threshold 386, the battery may be subject to rapid deterioration.

Stress adjusted battery consumption 390 for the battery in the example of FIG. 3, however, may be 111% or 114% of the actual number of completed cycles. For example, if the battery has completed 100 actual cycles, due to the overall battery stress acceleration factor, the battery may be determined to have effectively completed 111 cycles or 114 cycles. Therefore, the battery may be closer to the first threshold 382, second threshold 394, and third threshold 396 than indicated by the actual number of completed cycles. For example, the battery will actually be fully consumed before the baseline battery consumption anticipates, due to the particular usage and/or environment of the battery. In other embodiments, if the overall battery stress acceleration factor is less than 1.0, that may indicate the battery has been subject to less stress than the baseline, and may therefore have an adjusted number of cycles that is less than the actual number of completed cycles.

In some embodiments, the device may generate a first notification 374 indicating that the maximum output voltage value will be reduced, and/or with a recommendation for actions that the user can take to prevent a reduction. For example, the first notification 374 may indicate that the maximum charging voltage reduction can be prevented by avoiding high device temperatures. In a second notification 372, the notification may indicate to a user that the life of the battery has been extended as a result of recent usage or environmental data (e.g., the third and fourth time intervals 330). For example, the device may determine that an actual value is less than the estimated value, and may cause the maximum output voltage value to be increased from the third maximum output voltage value to the second maximum output voltage value (up to a maximum allowable battery voltage value of the battery). Other notifications may include user instructions, such as instructions to replace a device or battery, recommendations to delay reduction of the maximum allowed voltage to the third maximum allowed voltage, and so forth. Users may opt-in or opt-out of any notifications.

Figure 4:
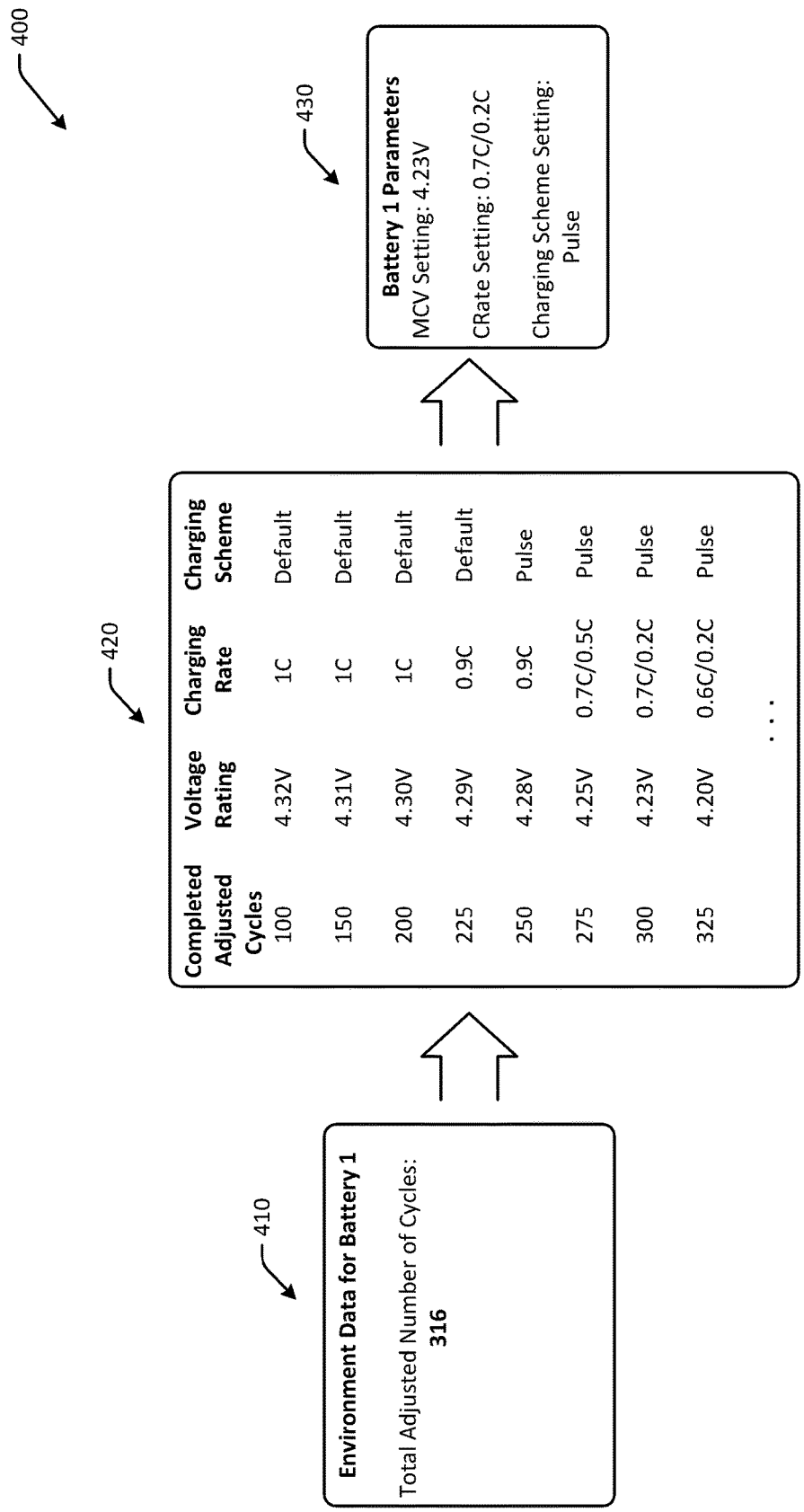
FIG. 4 is a schematic drawing of a use case of example battery environmental data, a sample battery parameter adjustment chart, and adjusted battery parameter data in accordance with one or more embodiments of the disclosure.

FIG. 4 is a schematic drawing of an example use case 400 of example battery environmental data, a sample battery parameter adjustment chart, and adjusted battery parameter data in accordance with one or more embodiments of the disclosure. Other embodiments may include additional, fewer, or different values or determinations, and may be in different formats, such as a database format, query format, or other structured or unstructured data format.

In FIG. 4, sample environmental data 410 is presented for a particular battery. The environmental data 410 may include, for the particular battery, environmental data such as the actual number of completed battery cycles, which may be 277, an aggregate stress factor of 1.14 (where 1.0 is a baseline), and a total adjusted number of cycles for the battery, which may be the product of the aggregate stress factor and the actual completed cycles, and may be 316. The aggregate stress factor may be the average stress factor for the battery over its lifetime. The aggregate stress factor may be determined by summing each individual stress factor calculation and dividing by the total number of events or time intervals over which the individual stress factors were determined. The total adjusted number of cycles for the battery in the example of FIG. 4 may be greater than the actual number of completed cycles (e.g., 316 vs. 277, etc.) because the battery has experienced more stress than a baseline expected amount of stress. The additional stress could come from usage, ambient environmental factors (e.g., temperature, etc.), over charging, and/or other events.

A battery parameter adjustment table 420 is depicted in FIG. 4 and may be used by a device and/or remote server to determine whether one or more battery parameters are to be modified based at least in part on the total adjusted number of completed cycles. For example, after 100 adjusted cycles have been completed, a voltage rating or maximum allowable charge of the battery may be derated to 4.32 volts. A charging rate for the battery may remain at 1 C, and the charging scheme may remain at a default charging scheme. The battery parameter adjustment table 420 may be a voltage table generated by a device or battery manufacturer or other entity using default or baseline ambient environmental conditions. The battery parameter adjustment table 420 may include thresholds, such as number of cycle thresholds, associated with corresponding maximum battery voltages. The maximum battery voltages may decline with time. For example, the battery parameter adjustment table 420 may include a maximum charging voltage (MCV) or voltage rating of 4.32V after completion of 100 cycles. After 500 cycles or another interval, the device or the battery may be recommended for replacement. The values of the battery parameter adjustment table 420 may be determined by a manufacturer or other entity and may be implemented so as to prevent battery swelling over time. Increases or decreases of maximum battery voltage may be performed linearly, exponentially (e.g., exponential curve fit, etc.), step response (e.g., threshold-based response, etc.), or another suitable method.

As the number of completed cycles increases, the voltage rating may continue to decrease to a rating of 4.20 volts. Similarly, as the number of completed cycles increases, the charging rate may change from 1 C to 0.9 C after 225 cycles, and may change to a two-tier charging rate of 0.7 C and 0.5 C after 275 cycles. For example, the battery may be charged at 0.7 C for a certain amount or percentage capacity, and the remainder of the battery may be charged at 0.5 C (e.g., a slower charging rate after 80% charge, etc.). The two-tier charging rate may be further reduced to 0.6 C and 0.2 C after 325 cycles have been completed, and so forth. The two-tier charging rate may reduce stress on the battery by providing a slower charge for a portion of the battery instead of a constant charging rate.

The charging scheme may remain default until, for example, 250 cycles have been completed, after which the charging scheme may change from a default charging scheme to a pulse charging scheme. The pulse charging scheme may reduce the stress on the battery by providing a pulsed charge instead of constant voltage and/or current, but may take longer to charge the battery.

The device may determine, using the battery parameter adjustment table 420, a set of battery parameters 430 to implement. For example, based at least in part on the total adjusted number of cycles of 316 for the battery, the device may determine that the maximum allowable charging voltage or maximum voltage of the battery is to be 4.23 volts, with a charging rate of 0.7 C/0.2 C, and a charging scheme setting of pulse charging.

Accordingly, the device may dynamically adjust battery parameters over time using the total adjusted number of cycles. In other embodiments, rather than determining an aggregate stress factor, the adjusted number of cycles completed during respective intervals may be added to determine the total adjusted number of cycles. As a result of implementation of the adjusted battery parameters, the life of the battery may be prolonged and risk of swelling and other incidents may be reduced.

Figure 5:
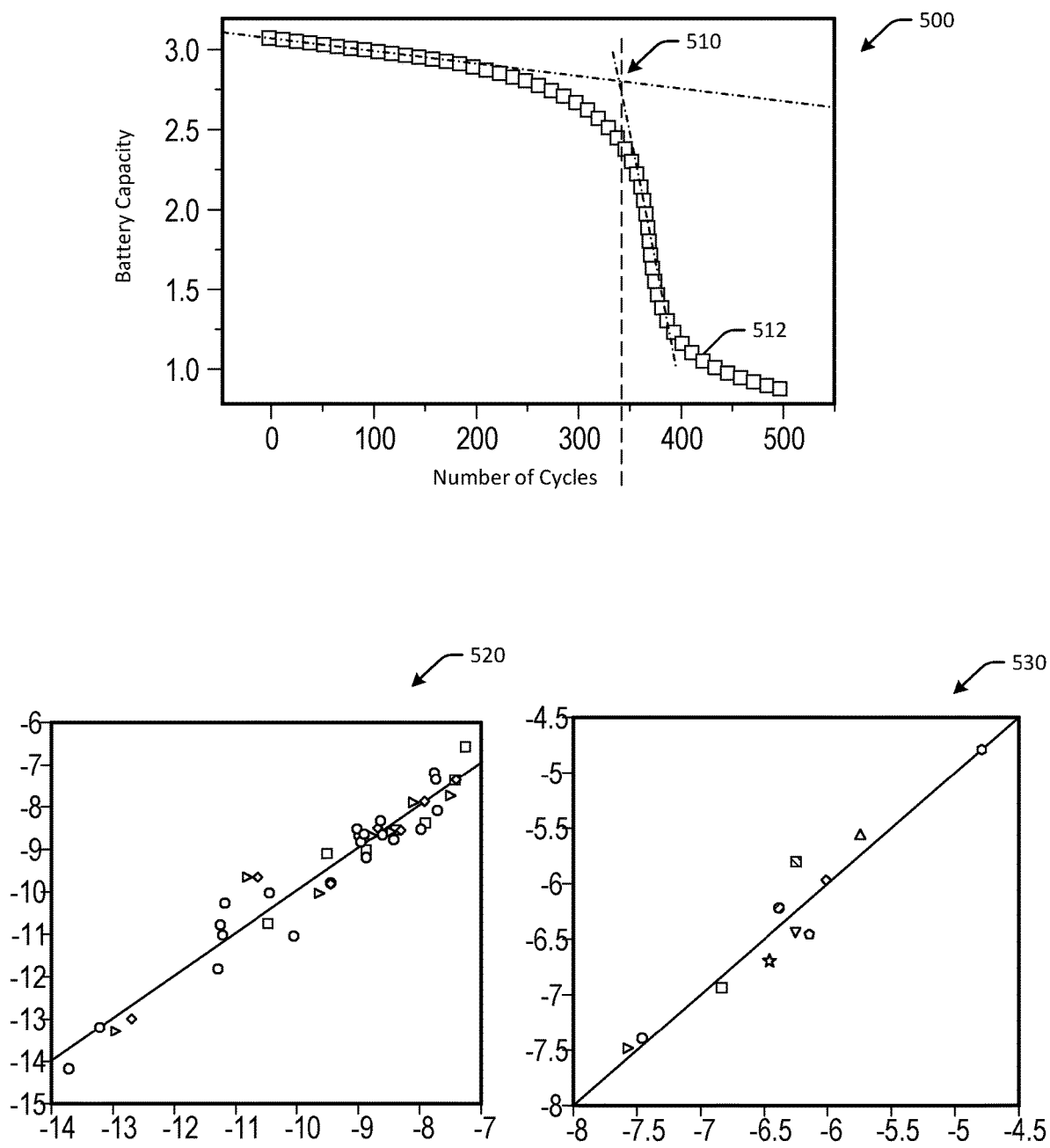
FIG. 5 depicts schematic drawings of various empirical data points from example batteries used to model predicted failure points and other battery features in accordance with one or more embodiments of the disclosure.

FIG. 5 depicts schematic drawings of various empirical data points from example batteries used to model predicted failure points and other battery features in accordance with one or more embodiments of the disclosure. The charts are for illustrative purposes only.

A first chart 500 in FIG. 5 represents a model used to project capacity loss of a battery over a number of completed cycles. For example, a battery may begin with a capacity, or maximum allowable charging voltage, of 3.0 volts (represented by line 512), and may begin to experience a sudden decline in capacity after completing about 345-350 cycles. The first chart 500 may represent empirical data for a certain battery using data collected from a number of the same type of battery. The sudden decline may occur at or near a "knee" or inflection point 510 after which the battery capacity quickly decreases. In some instances, the inflection point 510 may be the point after which battery failure is likely to occur.

A first portion of the chart 500 may be used to generate a first model for the battery that represents the projected capacity loss with battery cycling. The first portion of the chart may be the portion before the inflection point 510. A second portion of the chart 500, which may the portion after the inflection point 510, may be used to generate a second model for the battery that predicts the number of cycles to failure based on device-specific or battery-specific metrics. A number of cycles to failure may be the number of equivalent a charge cycles from first or initial use of the battery to the time die battery will likely fail. The two models may be used in conjunction to generate an acceleration factor or stress factor for a particular battery.

A second chart 520 depicts empirical data representing a rate of capacity loss over time, generated using a mathematical model, such as: $7.88+\text{Ln}(\text{DSoC}^{\wedge}1.007)-63.8/V_{max}-1638.6/(273+T)$. A cumulative loss in t (elapsed time)=$\Sigma \text{Exp}(11.3+1.007*\text{Ln}(\Sigma \Delta \text{SoC}_i)-63.8/V_{bucket\_i}-1638.6/(273+T_{bucket\_i}))$, where i is the voltage and time bucketed index, t is the time of loss evaluation, and $\Sigma \Delta \text{SoC}_i$ is the cumulative battery energy throughput at the voltage and time bucket index i at time t. The model may be adjusted to include different coefficients for the specific battery being modeled. The second chart 520 may be used to accumulate the amount of loss at time t and determine how many cycles remain before a predetermined threshold, such as a 20% loss. Once the threshold is satisfied, or before the threshold is satisfied, battery parameters, such as battery derating or reduction to a maximum allowed charging voltage may be implemented to slow down the loss and extend battery life.

A third chart 530 depicts empirical data representing a rate of damage that could lead to catastrophic failure over time (e.g., the inflection point 510 or the "knee," etc.), generated using a mathematical model, such as: $Ln(R) = 3.69 + 2.54*Ln(DSoC) - 78.8/V - 78.8/(CRate*(58-0.128(T-T_0)))$. Throughput acceleration relative to arbitrary 100% cycles can be calculated using $A_{DSoC} = (DSoC)^{2.54}/100^{2.54}$. Voltage acceleration to an arbitrary reference of 4.30V can be calculated using $A_V = Exp(-78.8/V)/Exp(-78.8/4.3)$. Charging rate acceleration at T relative to default settings of 0.5 C Charging Rate and 35 C can be calculated using $A_{CRate} = Exp(-78.8/(CRate*(58-0.128(T-35))))/Exp(78.8/(0.5*58))$.

Based at least in part on these calculations, the adjusted number of completed cycles for a particular battery can be determined using: t (elapsed time)=$\Sigma_i \Sigma_t$ Charging Events* $(A_{100\%} * A_{4.3}V * A_{0.5C,35C})_i$, where i is the bucket index, t is the time of the equivalent cycle evaluation, and $\Sigma_t$ Charging Events is the cumulative number of events up to time t in bucket i. The number of cycles to fail can be determined as a reference from running the specific battery type at the reference setting. For the second model, the battery may be operated with reference or default conditions to the catastrophic failure knee and the value may be used to determine the baseline or reference cycles to fail. The number of charging events may be accumulated after converting each to an equivalent number of reference cycles. As the number of reference cycles to fail is approached, or within a threshold amount or margin, battery parameters, such as battery derating or reduction to a maximum allowed charging voltage may be implemented to slow down the loss and extend battery life.

In some embodiments, the first and/or second models may be sent to devices for local execution and resultant local control over implementation of battery parameter adjustments. For example, a device may receive first data associated with a battery identifier of a battery, where the first data reflects the data in the second chart 520 and is indicative of an amount of capacity loss for the battery over a number of cycles. The device may receive second data associated with the battery identifier, where the second data reflects the data in the third chart 530 and is indicative of a number of charge cycles to failure for the battery. Thresholds to modify battery charging parameters may be a number of charge cycles that is less than the number of charge cycles to failure. The number of charge cycles to failure may be a number of complete discharges of the battery (e.g., from 100% capacity to 0% capacity, etc.) after which battery deterioration leads to increased risk of swelling, an inability to maintain a certain amount of voltage, and/or other issues. For example, for a 4.2 volt lithium ion battery, a number of charge cycles to failure may be 300 charge cycles. In this example, after 300 charge cycles, the battery may not be able to maintain a consistent voltage of 3.95 volts, and may not therefore be practically usable with a device. Other batteries may have different numbers of charge cycles to failure, and may be dependent on the size and/or capacity of the battery, as well as the particular chemistry of a battery.

In other embodiments, implementation of battery parameter adjustments may be controlled by remote server command In some instances, devices may generate models specific to the device itself using unsupervised learning, so as to provide an even more finely tuned adjustment schedule. For example, a device may receive first data associated with a battery identifier of a battery, where the first data reflects the data in the second chart 520 and is indicative of an amount of capacity loss for the battery over a number of cycles. Instead of receiving the second data, however, the device may generate, using an unsupervised learning model, second data indicative of a number of charge cycles to failure for the battery. Thus, the device may automatically generate the second data indicative of the number of charge cycles to failure for the battery. The device may then automatically determine the first threshold, where the first threshold includes a second number of charge cycles that is less than the number of charge cycles to failure.

One or more operations of the methods, process flows, or use cases of FIGS. 1-5 may have been described above as being performed by a user device, or more specifically, by one or more program module(s), applications, or the like executing on a device. It should be appreciated, however, that any of the operations of the methods, process flows, or use cases of FIGS. 1-5 may be performed, at least in part, in a distributed manner by one or more other devices, or more specifically, by one or more program module(s), applications, or the like executing on such devices. In addition, it should be appreciated that processing performed in response to the execution of computer-executable instructions provided as part of an application, program module, or the like may be interchangeably described herein as being performed by the application or the program module itself or by a device on which the application, program module, or the like is executing. While the operations of the methods, process flows, or use cases of FIGS. 1-5 may be described in the context of the illustrative devices, it should be appreciated that such operations may be implemented in connection with numerous other device configurations.

The operations described and depicted in the illustrative methods, process flows, and use cases of FIGS. 1-5 may be carried out or performed in any suitable order, such as the depicted orders, as desired in various example embodiments of the disclosure. Additionally, in certain example embodiments, at least a portion of the operations may be carried out in parallel. Furthermore, in certain example embodiments, less, more, or different operations than those depicted in FIGS. 1-5 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by the execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Illustrative Computer Architecture

Figure 6:
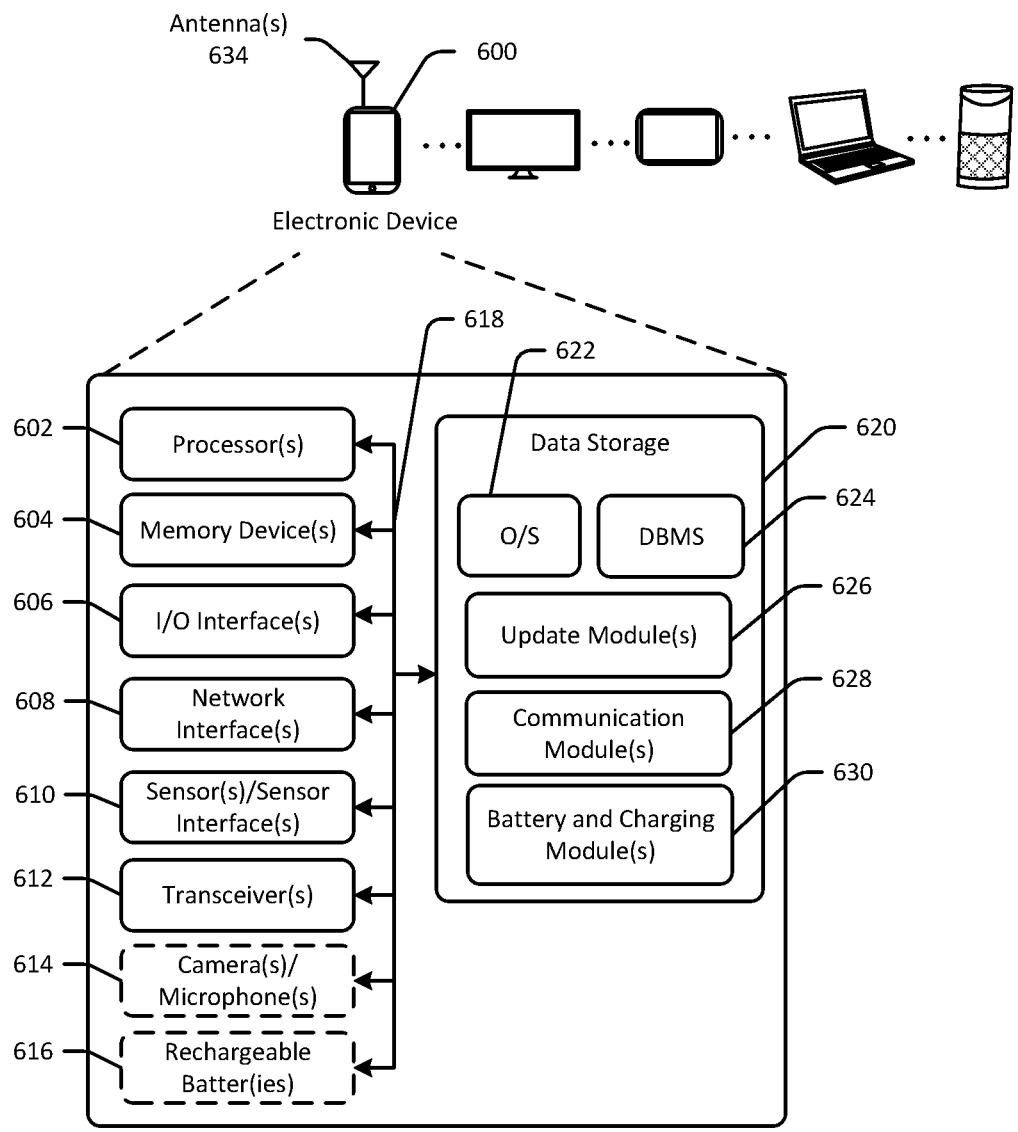
FIG. 6 schematically illustrates an example architecture of an electronic device in accordance with one or more embodiments of the disclosure.

FIG. 6 is a schematic block diagram of one or more illustrative electronic device(s) 600 in accordance with one or more example embodiments of the disclosure. The electronic device(s) 600 may include any suitable computing device including, but not limited to, a server system, a mobile device such as a smartphone, a tablet, an e-reader, a wearable device, or the like; a desktop computer; a laptop computer; a content streaming device; a set-top box; a scanning device; or the like. The electronic device(s) 600 may correspond to an illustrative device configuration for the device(s) of FIGS. 1-5.

The electronic device(s) 600 may be configured to communicate with one or more servers, user devices, or the like. The electronic device(s) 600 may be any suitable device, such as a mobile device, and may optionally be configured to determine voice commands, determine wakeword utterances, determine and/or control other devices, and other operations. The electronic device(s) 600 may be configured to present content, detect sound, output digital content, and other functionality In some embodiments, a single remote server or a single group of remote servers may be configured to perform more than one type of functionality in conjunction with an electronic device.

The electronic device(s) 600 may be configured to communicate via one or more networks. Such network(s) may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. Further, such network(s) may have any suitable communication range associated therewith and may include, for example, global networks (e.g., the Internet), metropolitan area networks (MANs), wide area networks (WANs), local area networks (LANs), or personal area networks (PANs). In addition, such network(s) may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a microwave medium, a radio frequency communication medium, a satellite communication medium, or any combination thereof.

In an illustrative configuration, the electronic device(s) 600 may include one or more processors (processor(s)) 602, one or more memory devices 604 (also referred to herein as memory 604), one or more input/output (I/O) interface(s) 606, one or more network interface(s) 608, one or more sensor(s) or sensor interface(s) 610, one or more transceiver(s) 612, one or more optional camera(s) and/or microphone(s) 614, one or more optional rechargeable batteries 616, and data storage 620. The electronic device(s) 600 may further include one or more bus(es) 618 that functionally couple various components of the electronic device(s) 600.

The electronic device(s) 600 may further include one or more antenna(s) 634 that may include, without limitation, a cellular antenna for transmitting or receiving signals to/from a cellular network infrastructure, an antenna for transmitting or receiving Wi-Fi signals to/from an access point (AP), a Global Navigation Satellite System (GNSS) antenna for receiving GNSS signals from a GNSS satellite, a Bluetooth antenna for transmitting or receiving Bluetooth signals, a Near Field Communication (NFC) antenna for transmitting or receiving NFC signals, and so forth. These various components will be described in more detail hereinafter.

The bus(es) 618 may include at least one of a system bus, a memory bus, an address bus, or a message bus, and may permit the exchange of information (e.g., data (including computer-executable code), signaling, etc.) between various components of the electronic device(s) 600. The bus(es) 618 may include, without limitation, a memory bus or a memory controller, a peripheral bus, an accelerated graphics port, and so forth. The bus(es) 618 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnect (PCI) architecture, a PCI-Express architecture, a Personal Computer Memory Card International Association (PCMCIA) architecture, a Universal Serial Bus (USB) architecture, and so forth.

The memory 604 of the electronic device(s) 600 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 604 may include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 604 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 620 may include removable storage and/or non-removable storage including, but not limited to, magnetic storage, optical disk storage, and/or tape storage. The data storage 620 may provide non-volatile storage of computer-executable instructions and other data. The memory 604 and the data storage 620, removable and/or non-removable, are examples of computer-readable storage media (CRSM) as that term is used herein.

The data storage 620 may store computer-executable code, instructions, or the like that may be loadable into the memory 604 and executable by the processor(s) 602 to cause the processor(s) 602 to perform or initiate various operations. The data storage 620 may additionally store data that may be copied to the memory 604 for use by the processor(s) 602 during the execution of the computer-executable instructions. Moreover, output data generated as a result of execution of the computer-executable instructions by the processor(s) 602 may be stored initially in the memory 604, and may ultimately be copied to the data storage 620 for non-volatile storage.

More specifically, the data storage 620 may store one or more operating systems (O/S) 622; one or more database management systems (DBMS) 624; and one or more program module(s), applications, engines, computer-executable code, scripts, or the like such as, for example, one or more update module(s) 626, one or more communication module(s) 628, and/or one or more battery and charging module(s) 630. Some or all of these module(s) may be sub-module(s). Any of the components depicted as being stored in the data storage 620 may include any combination of software, firmware, and/or hardware. The software and/or firmware may include computer-executable code, instructions, or the like that may be loaded into the memory 604 for execution by one or more of the processor(s) 602. Any of the components depicted as being stored in the data storage 620 may support functionality described in reference to corresponding components named earlier in this disclosure.

The data storage 620 may further store various types of data utilized by the components of the electronic device(s) 600. Any data stored in the data storage 620 may be loaded into the memory 604 for use by the processor(s) 602 in executing computer-executable code. In addition, any data depicted as being stored in the data storage 620 may potentially be stored in one or more datastore(s) and may be accessed via the DBMS 624 and loaded in the memory 604 for use by the processor(s) 602 in executing computer-executable code. The datastore(s) may include, but are not limited to, databases (e.g., relational, object-oriented, etc.), file systems, flat files, distributed datastores in which data is stored on more than one node of a computer network, peer-to-peer network datastores, or the like. In FIG. 6, an example datastore(s) may include, for example, historical data for previously identified products, purchase or order history, user profile information, and/or other information.

The processor(s) 602 may be configured to access the memory 604 and execute the computer-executable instructions loaded therein. For example, the processor(s) 602 may be configured to execute the computer-executable instructions of the various program module(s), applications, engines, or the like of the electronic device(s) 600 to cause or facilitate various operations to be performed in accordance with one or more embodiments of the disclosure. The processor(s) 602 may include any suitable processing unit capable of accepting data as input, processing the input data in accordance with stored computer-executable instructions, and generating output data. The processor(s) 602 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 602 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 602 may be capable of supporting any of a variety of instruction sets.

Referring now to functionality supported by the various program module(s) depicted in FIG. 6, the update module(s) 626 may include computer-executable instructions, code, or the like that responsive to execution by one or more of the processor(s) 602 may perform functions including, but not limited to, requesting and/or receiving software updates, such as over-the-air updates, requesting battery voltage data, storing data, modifying maximum battery charge values at integrated circuits, such as at a Power Management Integrated Circuit, controlling charging schemes and/or charging parameters, and the like.

The communication module(s) 628 may include computer-executable instructions, code, or the like that responsive to execution by one or more of the processor(s) 602 may perform functions including, but not limited to, sending and/or receiving data, including content, sending and/or receiving instructions and commands, and the like.

The battery and charging module(s) 630 may include computer-executable instructions, code, or the like that responsive to execution by one or more of the processor(s) 602 may perform functions including, but not limited to, determining a charging voltage or other charging parameter, calculating elapsed time, calculating battery environment values, calculating acceleration or stress factors, calculating deceleration factors, adjusting charging voltages, determining predicted usage, determining voltage and/or temperature data, and the like.

Referring now to other illustrative components depicted as being stored in the data storage 620, the O/S 622 may be loaded from the data storage 620 into the memory 604 and may provide an interface between other application software executing on the electronic device(s) 600 and the hardware resources of the electronic device(s) 600. More specifically, the O/S 622 may include a set of computer-executable instructions for managing the hardware resources of the electronic device(s) 600 and for providing common services to other application programs (e.g., managing memory allocation among various application programs). In certain example embodiments, the O/S 622 may control execution of the other program module(s). The O/S 622 may include any operating system now known or which may be developed in the future including, but not limited to, any server operating system, any mainframe operating system, or any other proprietary or non-proprietary operating system.

The DBMS 624 may be loaded into the memory 604 and may support functionality for accessing, retrieving, storing, and/or manipulating data stored in the memory 604 and/or data stored in the data storage 620. The DBMS 624 may use any of a variety of database models (e.g., relational model, object model, etc.) and may support any of a variety of query languages. The DBMS 624 may access data represented in one or more data schemas and stored in any suitable data repository including, but not limited to, databases (e.g., relational, object-oriented, etc.), file systems, flat files, distributed datastores in which data is stored on more than one node of a computer network, peer-to-peer network datastores, or the like. In those example embodiments in which the electronic device(s) 600 is a mobile device, the DBMS 624 may be any suitable lightweight DBMS optimized for performance on a mobile device.

Referring now to other illustrative components of the electronic device(s) 600, the input/output (I/O) interface(s) 606 may facilitate the receipt of input information by the electronic device(s) 600 from one or more I/O devices as well as the output of information from the electronic device(s) 600 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the electronic device(s) 600 or may be separate. The I/O devices may further include, for example, any number of peripheral devices such as data storage devices, printing devices, and so forth.

The I/O interface(s) 606 may also include an interface for an external peripheral device connection such as universal serial bus (USB), FireWire, Thunderbolt, Ethernet port or other connection protocol that may connect to one or more networks. The I/O interface(s) 606 may also include a connection to one or more of the antenna(s) 634 to connect to one or more networks via a wireless local area network (WLAN) (such as Wi-Fi) radio, Bluetooth, ZigBee, and/or a wireless network radio, such as a radio capable of communication with a wireless communication network such as a Long Term Evolution (LTE) network, WiMAX network, 3G network, a ZigBee network, etc.

The electronic device(s) 600 may further include one or more network interface(s) 608 via which the electronic device(s) 600 may communicate with any of a variety of other systems, platforms, networks, devices, and so forth. The network interface(s) 608 may enable communication, for example, with one or more wireless routers, one or more host servers, one or more web servers, and the like via one or more networks.

The antenna(s) 634 may include any suitable type of antenna depending, for example, on the communications protocols used to transmit or receive signals via the antenna(s) 634. Non-limiting examples of suitable antennas may include directional antennas, non-directional antennas, dipole antennas, folded dipole antennas, patch antennas, multiple-input multiple-output (MIMO) antennas, or the like. The antenna(s) 634 may be communicatively coupled to one or more transceivers 612 or radio components to which or from which signals may be transmitted or received.

As previously described, the antenna(s) 634 may include a cellular antenna configured to transmit or receive signals in accordance with established standards and protocols, such as Global System for Mobile Communications (GSM), 3G standards (e.g., Universal Mobile Telecommunications System (UMTS), Wideband Code Division Multiple Access (W-CDMA), CDMA2000, etc.), 4G standards (e.g., Long-Term Evolution (LTE), WiMax, etc.), direct satellite communications, or the like.

The antenna(s) 634 may additionally, or alternatively, include a Wi-Fi antenna configured to transmit or receive signals in accordance with established standards and protocols, such as the IEEE 802.11 family of standards, including via 2.4 GHz channels (e.g., 802.11b, 802.11g, 802.11n), 5 GHz channels (e.g., 802.11n, 802.11ac), or 60 GHz channels (e.g., 802.11ad). In alternative example embodiments, the antenna(s) 634 may be configured to transmit or receive radio frequency signals within any suitable frequency range forming part of the unlicensed portion of the radio spectrum.

The antenna(s) 634 may additionally, or alternatively, include a GNSS antenna configured to receive GNSS signals from three or more GNSS satellites carrying time-position information to triangulate a position therefrom. Such a GNSS antenna may be configured to receive GNSS signals from any current or planned GNSS such as, for example, the Global Positioning System (GPS), the GLONASS System, the Compass Navigation System, the Galileo System, or the Indian Regional Navigational System.

The transceiver(s) 612 may include any suitable radio component(s) for—in cooperation with the antenna(s) 634—transmitting or receiving radio frequency (RF) signals in the bandwidth and/or channels corresponding to the communications protocols utilized by the electronic device(s) 600 to communicate with other devices. The transceiver(s) 612 may include hardware, software, and/or firmware for modulating, transmitting, or receiving—potentially in cooperation with any of antenna(s) 634—communications signals according to any of the communications protocols discussed above including, but not limited to, one or more Wi-Fi and/or Wi-Fi direct protocols, as standardized by the IEEE 802.11 standards, one or more non-Wi-Fi protocols, or one or more cellular communications protocols or standards. The transceiver(s) 612 may further include hardware, firmware, or software for receiving GNSS signals. The transceiver(s) 612 may include any known receiver and baseband suitable for communicating via the communications protocols utilized by the electronic device(s) 600. The transceiver(s) 612 may further include a low noise amplifier (LNA), additional signal amplifiers, an analog-to-digital (A/D) converter, one or more buffers, a digital baseband, or the like.

The sensor(s)/sensor interface(s) 610 may include or may be capable of interfacing with any suitable type of sensing device such as, for example, inertial sensors, force sensors, thermal sensors, photocells, and so forth. Example types of inertial sensors may include accelerometers (e.g., MEMS-based accelerometers), gyroscopes, and so forth.

The camera(s) 614 may be any device configured to capture ambient light or images. The microphone(s) 614 may be any device configured to receive analog sound input or voice data. The rechargeable batter(ies) 616 may be any suitable power storage device, such as a lithium ion battery and may be in various form factors, such as pouch form factors, cylindrical form factors, and the like.

It should be appreciated that the program module(s), applications, computer-executable instructions, code, or the like depicted in FIG. 6 as being stored in the data storage 620 are merely illustrative and not exhaustive and that processing described as being supported by any particular module may alternatively be distributed across multiple module(s) or performed by a different module. In addition, various program module(s), script(s), plug-in(s), Application Programming Interface(s) (API(s)), or any other suitable computer-executable code hosted locally on the electronic device(s) 600, and/or hosted on other computing device(s) accessible via one or more networks, may be provided to support functionality provided by the program module(s), applications, or computer-executable code depicted in FIG. 6 and/or additional or alternate functionality. Further, functionality may be modularized differently such that processing described as being supported collectively by the collection of program module(s) depicted in FIG. 6 may be performed by a fewer or greater number of module(s), or functionality described as being supported by any particular module may be supported, at least in part, by another module. In addition, program module(s) that support the functionality described herein may form part of one or more applications executable across any number of systems or devices in accordance with any suitable computing model such as, for example, a client-server model, a peer-to-peer model, and so forth. In addition, any of the functionality described as being supported by any of the program module(s) depicted in FIG. 6 may be implemented, at least partially, in hardware and/or firmware across any number of devices.

It should further be appreciated that the electronic device(s) 600 may include alternate and/or additional hardware, software, or firmware components beyond those described or depicted without departing from the scope of the disclosure. More particularly, it should be appreciated that software, firmware, or hardware components depicted as forming part of the electronic device(s) 600 are merely illustrative and that some components may not be present or additional components may be provided in various embodiments. While various illustrative program module(s) have been depicted and described as software module(s) stored in the data storage 620, it should be appreciated that functionality described as being supported by the program module(s) may be enabled by any combination of hardware, software, and/or firmware. It should further be appreciated that each of the above-mentioned module(s) may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other module(s). Further, one or more depicted module(s) may not be present in certain embodiments, while in other embodiments, additional module(s) not depicted may be present and may support at least a portion of the described functionality and/or additional functionality. Moreover, while certain module(s) may be depicted and described as sub-module(s) of another module, in certain embodiments, such module(s) may be provided as independent module(s) or as sub-module(s) of other module(s).

Program module(s), applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program module(s), or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

That which is claimed is:

1. A device comprising:
a battery having a first maximum allowed charging voltage;
memory configured to store computer-executable instructions; and
at least one computer processor configured to access the memory and execute the computer-executable instructions to:
determine a first charging rate at the battery, wherein the first charging rate is indicative of a speed at which the battery charges;
determine a first battery temperature of the battery during a first time interval;
determine a first battery output voltage during the first time interval;
determine a first stress acceleration factor for the battery during the first time interval using the first charging rate, the first battery temperature, and the first battery output voltage, wherein a default stress acceleration factor is 1.0 for default usage of the battery;
determine a first number of actual charge cycles of the battery during the first time interval;
determine a first adjusted number of charge cycles of the battery during the first time interval by multiplying the first number of actual charge cycles by the first stress acceleration factor, wherein the first adjusted number of charge cycles is indicative of actual usage of the battery during the first time interval relative to default usage of the battery during the first time interval;
determine a historical adjusted number of charge cycles of the battery;
determine a total adjusted number of charge cycles of the battery by adding first adjusted number of charge cycles to the historical adjusted number of charge cycles;
determine that the total adjusted number of charge cycles satisfies a first battery derating threshold at which the first maximum allowed charging voltage is reduced to a second maximum allowed charging voltage; and
cause the battery to limit charging to the second maximum allowed charging voltage.

2. The device of claim 1, wherein the at least one processor is further configured to access the memory and execute the computer-executable instructions to:
receive first data associated with a battery identifier of the battery, the first data indicative of an amount of capacity loss for the battery over a number of cycles; and
receive second data associated with the battery identifier, the second data indicative of a number of charge cycles to failure for the battery;
wherein the first battery derating threshold represents a second number of charge cycles that is less than the number of charge cycles to failure.

3. The device of claim 1, wherein the at least one processor is further configured to access the memory and execute the computer-executable instructions to:
determine a second battery temperature of the battery during a second time interval;
determine a second battery output voltage during the second time interval;
determine a second stress acceleration factor for the battery during the second time interval using the first charging rate, the second battery temperature, and the second battery output voltage;
determine a second number of actual charge cycles of the battery during the second time interval;
determine a second adjusted number of charge cycles of the battery during the first time interval using the second stress acceleration factor and the second number of actual charge cycles;
determine the total adjusted number of charge cycles of the battery by adding second adjusted number of charge cycles to the historical adjusted number of charge cycles;
determine that the total adjusted number of charge cycles satisfies a charging rate reduction threshold at which the first charging rate is reduced to a second charging rate; and
cause a charging circuit at the device to implement the second charging rate.

4. The device of claim 1, wherein the at least one processor is further configured to access the memory and execute the computer-executable instructions to:
determine that the total adjusted number of charge cycles satisfies a battery charging scheme threshold at which a pulse charging scheme is implemented; and
cause a charging circuit at the device implement the pulse charging scheme.

5. A device comprising:
a battery having an associated first maximum output voltage value;
memory configured to store computer-executable instructions; and
at least one computer processor configured to access the memory and execute the computer-executable instructions to:
determine a first value indicative of a battery voltage output during a first time interval;
determine a second value indicative of a temperature of the battery during the first time interval;
determine a first acceleration factor for the battery based at least in part on the first value and the second value;
determine, using the first acceleration factor and an actual number of charge cycles during the first time interval, a first adjusted number of charge cycles;
determine a total adjusted number of charge cycles of the battery from initial use to an end of the first time interval using: (i) the first adjusted number of charge cycles, and (ii) a historical adjusted number of charge cycles prior to the first time interval;

determine that the total adjusted number of charge cycles is equal to or greater than a first threshold; and cause the first maximum output voltage value to be reduced to a second maximum output voltage value.

6. The device of claim 5, wherein the at least one processor is further configured to access the memory and execute the computer-executable instructions to:

determine a third value indicative of (i) a charging rate or (ii) a throughput at the battery;

wherein the at least one processor is further configured to determine the first acceleration factor based at least in part on the first value, the second value, and the third value.

7. The device of claim 5, wherein the device further comprises a charging circuit configured to implement a first charging rate indicative of a speed at which the battery is charged, and wherein the at least one processor is further configured to access the memory and execute the computer-executable instructions to:

determine that the total adjusted number of charge cycles is equal to or greater than a second threshold that is greater than the first threshold; and cause the charging circuit to implement a second charging rate instead of the first charging rate, wherein the second charging rate is slower than the first charging rate.

8. The device of claim 5, wherein the at least one processor is further configured to access the memory and execute the computer-executable instructions to:

determine a third value indicative of battery voltage output during a second time interval;

determine a fourth value indicative of battery temperature during the second time interval;

determine a fifth value indicative of a first charging rate at the battery during the second time interval;

determine a second acceleration factor for the second time interval based at least in part on the third value, the fourth value, and the fifth value;

determine a number of actual charge cycles of the battery during the second time interval;

determine a second adjusted number of charge cycles of the battery during the second time interval based at least in part on the second acceleration factor and the number of actual charge cycles;

determine an updated total adjusted number of charge cycles of the battery from initial use to an end of the second time interval based at least in part on the second adjusted number of charge cycles and the historical adjusted number of charge cycles;

determine that the total adjusted number of charge cycles satisfies a second threshold; and cause a charging circuit at the device to implement a second charging rate instead of the first charging rate, wherein the second charging rate is slower than the first charging rate.

9. The device of claim 5, wherein the at least one processor is further configured to access the memory and execute the computer-executable instructions to:

determine that the total adjusted number of charge cycles satisfies a third threshold; and cause the second maximum output voltage value to be reduced to a third maximum output voltage value.

10. The device of claim 5, wherein the at least one processor is configured to determine the second value indicative of the temperature during the first time interval by executing the computer-executable instructions to:

determine a first temperature of the battery during the first time interval;

determine a second temperature of the device during the first time interval; and determine the second value using the first temperature and the second temperature.

11. The device of claim 5, wherein the at least one processor is further configured to access the memory and execute the computer-executable instructions to:

determine that the total adjusted number of charge cycles satisfies a second threshold; and cause a charging circuit at the device implement a modified charging scheme.

12. The device of claim 5, wherein the at least one processor is further configured to access the memory and execute the computer-executable instructions to:

receive first data associated with the battery, the first data indicative of an amount of capacity loss for the battery over a number of cycles; and receive second data associated with the battery, the second data indicative of a number of charge cycles to failure for the battery;

wherein the first threshold represents a second number of charge cycles that is less than the number of charge cycles to failure.

13. The device of claim 5, wherein the at least one processor is further configured to access the memory and execute the computer-executable instructions to:

receive first data associated with the battery, the first data indicative of an amount of capacity loss for the battery over a number of cycles;

generate, using an unsupervised learning model, second data indicative of a number of charge cycles to failure for the battery; and determine the first threshold, wherein the first threshold is less than the number of charge cycles to failure.

14. The device of claim 5, wherein the first time interval occurs between charging events for the battery.

15. A method comprising:

determining, by a device comprising a battery, a first value indicative of a battery voltage output during a first time interval, wherein the battery has an associated first maximum output voltage value;

determining a second value indicative of a temperature of the battery during the first time interval;

determining a first acceleration factor for the battery based at least in part on the first value and the second value;

determining, using the first acceleration factor and an actual number of charge cycles during the first time interval, a first adjusted number of charge cycles completed during the first time interval using the first acceleration factor;

determining a total adjusted number of charge cycles of the battery from initial use to an end of the first time interval using: (i) the first adjusted number of charge cycles, and (ii) a historical adjusted number of charge cycles prior to the first time interval;

determining that the total adjusted number of charge cycles is equal to or greater than a first threshold; and causing the first maximum output voltage value to be reduced to a second maximum output voltage value.

16. The method of claim 15, further comprising:

determining a third value indicative of a charging rate at the battery;

wherein determining the first acceleration factor comprises determining the first acceleration factor based at least in part on the first value, the second value, and the third value.

17. The method of claim 15, wherein the device further comprises a charging circuit configured to implement a first charging rate indicative of a speed at which the battery is charged, the method further comprising:
   determining that the total adjusted number of charge cycles is equal to or greater than a second threshold that is greater than the first threshold; and
   causing the charging circuit to implement a second charging rate instead of the first charging rate, wherein the second charging rate is slower than the first charging rate.

18. The method of claim 15, further comprising:
   determining a third value indicative of battery voltage output during a second time interval;
   determining a fourth value indicative of battery temperature during the second time interval;
   determining a fifth value indicative of a first charging rate at the battery during the second time interval;
   determining a second acceleration factor for the second time interval based at least in part on the third value, the fourth value, and the fifth value;
   determining a number of actual charge cycles of the battery during the second time interval;
   determining a second adjusted number of charge cycles of the battery during the second time interval based at least in part on the second acceleration factor and the number of actual charge cycles;
   determining an updated total adjusted number of charge cycles of the battery from initial use to an end of the second time interval based at least in part on the second adjusted number of charge cycles and the historical adjusted number of charge cycles;
   determining that the total adjusted number of charge cycles satisfies a second threshold; and
   causing a charging circuit at the device to implement a second charging rate instead of the first charging rate, wherein the second charging rate is slower than the first charging rate.

19. The method of claim 15, further comprising:
   determining that the total adjusted number of charge cycles satisfies a third threshold; and
   causing the second maximum output voltage value to be reduced to a third maximum output voltage value.

20. The method of claim 15, further comprising:
   determining that the total adjusted number of charge cycles satisfies a second threshold; and
   causing a charging circuit at the device implement a modified charging scheme.

* * * * *